(12) United States Patent
Li et al.

(10) Patent No.: US 11,238,764 B2
(45) Date of Patent: Feb. 1, 2022

(54) LIGHT EMITTING CONTROL CIRCUIT, DRIVING METHOD THEREOF, ARRAY SUBSTRATE AND DISPLAY DEVICE

(71) Applicant: BOE TECHNOLOGY GROUP CO., LTD., Beijing (CN)

(72) Inventors: Shengnan Li, Beijing (CN); Wei Qin, Beijing (CN); Tieshi Wang, Beijing (CN); Weixing Liu, Beijing (CN); Dongni Liu, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 16/942,218

(22) Filed: Jul. 29, 2020

(65) Prior Publication Data

US 2021/0097908 A1    Apr. 1, 2021

(51) Int. Cl.
  *G09G 3/00* (2006.01)
  *G01R 31/52* (2020.01)
  *G09G 3/32* (2016.01)
  *G09G 3/30* (2006.01)

(52) U.S. Cl.
  CPC ............ *G09G 3/006* (2013.01); *G01R 31/52* (2020.01); *G09G 3/30* (2013.01); *G09G 3/32* (2013.01); *G09G 2330/12* (2013.01)

(58) Field of Classification Search
  CPC ............ G09G 3/006; G09G 3/30; G09G 3/32; G09G 3/3225; G09G 2330/12; G09G 2320/029; G09G 2320/0295; G01R 31/52; G01R 31/2635

USPC ............................................................ 345/55
  See application file for complete search history.

(56) References Cited

U.S. PATENT DOCUMENTS

| | | | |
|---|---|---|---|
| 9,972,252 B2 * | 5/2018 | Choi | H01L 27/3288 |
| 10,380,946 B2 * | 8/2019 | Liu | G09G 3/3258 |
| 10,878,734 B1 * | 12/2020 | Watsuda | G09G 3/3233 |
| 2012/0032938 A1 | 2/2012 | Park | |
| 2015/0116302 A1 | 4/2015 | Kim et al. | |
| 2017/0243540 A1 | 8/2017 | Liu | |
| 2018/0061296 A1 | 3/2018 | Shim | |

(Continued)

FOREIGN PATENT DOCUMENTS

| | | |
|---|---|---|
| CN | 102376250 A | 3/2012 |
| CN | 102467881 A | 5/2012 |

(Continued)

*Primary Examiner* — Jason M Mandeville
(74) *Attorney, Agent, or Firm* — Muncy, Geissler, Olds & Lowe, P.C.

(57) ABSTRACT

The present disclosure provides a light emitting control circuit, an array substrate and a display device, and a driving method of the light emitting control circuit. The light emitting control circuit includes: a light emitting device; a driving circuit including a driving switch device configured to drive the light emitting device to emit light when the driving switch device is turned on; a detection circuit, configured to detect whether the light emitting device is short-circuited in the detection stage of the light emitting control circuit; if the light emitting device is short-circuited, the driving switch device is turned off in the light emitting stage of the light emitting control circuit; if the light emitting device is not short-circuited, the driving switch device is turned on in the light emitting stage of the light emitting control circuit.

10 Claims, 3 Drawing Sheets

(56) References Cited

U.S. PATENT DOCUMENTS

| | | | |
|---|---|---|---|
| 2018/0284498 A1 | 10/2018 | Park | |
| 2018/0301094 A1* | 10/2018 | Liu | ................ G09G 3/3266 |
| 2020/0074938 A1* | 3/2020 | Kim | ................ G09G 3/3266 |

FOREIGN PATENT DOCUMENTS

| | | | | |
|---|---|---|---|---|
| CN | 104575341 A | 4/2015 | | |
| CN | 104717813 A | 6/2015 | | |
| CN | 105528995 A | 4/2016 | | |
| CN | 206271397 U | 6/2017 | | |
| CN | 206301579 U | 7/2017 | | |
| CN | 107799040 A | 3/2018 | | |
| CN | 108682385 A | 10/2018 | | |
| CN | 209401290 U | 9/2019 | | |
| KR | 20170064163 A | 6/2017 | | |
| WO | WO-2018113221 A1 * | 6/2018 | ........... G09G 3/3233 | |

\* cited by examiner

LIGHT EMITTING CONTROL CIRCUIT, DRIVING METHOD THEREOF, ARRAY SUBSTRATE AND DISPLAY DEVICE

CROSS-REFERENCE TO RELATED APPLICATION

This application is based on and claims priority of Chinese Patent Application No. 201910945598.4, filed on Sep. 30, 2019, which is incorporated herein by reference in its entirety.

TECHNICAL FIELD

The present disclosure relates to the field of display technologies, in particular to a light emitting control circuit, an array substrate and a display device, and a driving method of the light emitting control circuit.

BACKGROUND

Micro Light Emitting Diode (Micro LED) device is expected to become the next generation mainstream display technology due to the characteristics of high efficiency and strong resistance to water and oxygen.

In the field of display technology, especially in the super-large size display technology, Micro LED devices help to achieve better display effect and lower cost. In the current applications, Micro LED can be firstly fabricated on a substrate and then assembled by means of transfer printing onto another substrate with larger size and logic circuits, so as to meet the needs of large-size display screens such as mobile phones and televisions.

SUMMARY

According to the embodiments of the present disclosure, a light emitting control circuit is provided, the light emitting control circuit includes:

a light emitting device;

a driving circuit including a driving switch device, a first terminal of the driving switch device is connected with an anode of the light emitting device, the driving switch device is configured to drive the light emitting device to emit light when the driving switch device is turned on;

a detection circuit, one terminal of the detection circuit is connected with a control terminal of the driving switch device, and the other terminal of the detection circuit is connected with the anode of the light emitting device, the detection circuit is configured to detect whether the light emitting device is short-circuited in the detection stage of the light emitting control circuit; if the light emitting device is short-circuited, the driving switch device is turned off in the light emitting stage of the light emitting control circuit; if the light emitting device is not short-circuited, the driving switch device is turned on in the light emitting stage of the light emitting control circuit.

Optionally, the detection circuit includes:

a first switch device, a first terminal of the first switch device is connected with the control terminal of the driving switch device, a second terminal of the first switch device is connected with a test voltage terminal; a difference between the test voltage provided by the test voltage terminal and the voltage on the second terminal of the driving switch device is greater than the turning-on voltage of the driving switch device; the first switch device is configured to be turned on in the detection stage if the light emitting device is short-circuited, or turned off in the detection stage if the light emitting device is not short-circuited;

a second switch device, a first terminal of the second switch device is connected with the control terminal of the first switch device, a control terminal of the second switch device receives a detection control signal, a second terminal of the second switch device is connected with the anode of the light emitting device; the second switch device is configured to be turned on in the detection stage in response to the detection control signal, and turned off in the light emitting stage in response to the detection control signal.

Optionally, the first switch device is a P-type TFT transistor, and the second switch device is an N-type TFT transistor.

Optionally, the driving circuit further includes:

a data writing switch device, a first terminal of the data writing switch device is connected with the data voltage terminal, and the control terminal of the data writing switch device receives a gate control signal, the second terminal of the data writing switch device is connected with the control terminal of the driving switch device, the data writing switch device is configured to be turned on in response to the gate control signal in the data writing stage of the light emitting control circuit, and turned off in response to the gate control signal in the detection stage and the light emitting stage;

a light emitting control switch device, a first terminal of the light emitting control switch device is connected with a power supply, and the control terminal of the light emitting control switch device receives a light emitting control signal, the second terminal of the light emitting control switch device is connected with the second terminal of the driving switch device, the light emitting control switch device is configured to be turned off in response to the light emitting control signal in the data writing stage and the detection stage, and turned on in response to the light emitting control signal in the light emitting stage; and a capacitor, one terminal of the capacitor is respectively connected with the second terminal of the data writing switch device and the control terminal of the driving switch device, the other terminal of the capacitor is respectively connected with the second terminal of the light emitting control switch device and the second terminal of the driving switch device.

Optionally, the driving switch device, the data writing switch device and the light emitting control switch device are P-type TFT transistors.

Optionally, the threshold voltage range of the first switch device is:

$$VSS-Vtest < Vth1 < VSS+Vled-Vtest$$

wherein, VSS is the cathode potential of the light emitting device, Vtest is the test voltage, Vth1 is the threshold voltage of the first switch device, and Vled is the turning-on voltage of the light emitting device.

Optionally, the threshold voltage range of the driving switch device is:

$$VData-VDD < Vth3 < Vtest-VDD$$

wherein, VData is the data voltage provided by the data voltage terminal, VDD is the power supply voltage, Vth3 is the threshold voltage of the driving switch device, and Vtest is the test voltage.

According to the embodiments of the present disclosure, an array substrate is further provided, the array substrate includes a plurality of pixel units arranged in an array, each of which includes a light emitting control circuit described above.

According to the embodiments of the present disclosure, a display device including the above array substrate is further provided.

According to the embodiments of the present disclosure, a method for driving the light emitting control circuit is further provided, the driving method includes a data writing stage, a detection stage and a light emitting stage, wherein in the data writing stage, the driving switch device and the detection circuit are turned off, and the data voltage is applied across the control terminal of the driving switch device and the second terminal of the driving switch device through the driving circuit;

in the detection stage, the driving circuit is turned off, and the detection circuit detects whether the light emitting device is short-circuited;

in the light emitting stage, if the light emitting device is short-circuited, the driving switch device is controlled by the detection circuit to be turned off, and if the light emitting device is not short-circuited, the driving switch device is controlled by the detection circuit to be turned on, so that the driving switch device drives the light emitting device to emit light.

According to the embodiments of the present disclosure, the light emitting control circuit is provided on a back plate, and includes: a light emitting device; a driving circuit including a driving switch device, a first terminal of the driving switch device is connected with an anode of the light emitting device, the driving switch device is configured to drive the light emitting device to emit light when the driving switch device is turned on; a detection circuit, one terminal of the detection circuit is connected with a control terminal of the driving switch device, and the other terminal of the detection circuit is connected with the anode of the light emitting device, the detection circuit is configured to detect whether the light emitting device is short-circuited in the detection stage of the light emitting control circuit; if the light emitting device is short-circuited, the driving switch device is turned off in the light emitting stage of the light emitting control circuit, so as to avoid burning the back plate due to the short-circuit of the light emitting device; and if the light emitting device is not short-circuited, the driving switch device is turned on in the light emitting stage of the light emitting control circuit, so as to ensure that the light emitting device which is not short-circuited can emit light normally during the light emitting stage.

DETAILED DESCRIPTION

In order to illustrate the objects, technical solutions and merits of the present disclosure in a clearer manner, the present disclosure will be described in detail in conjunction with the accompanying drawings and specific embodiments.

At present, in a display device applying Micro LED devices, the substrate on which the Micro LED devices are grown is not the same as the substrate in the display device. The Micro LED devices need to be transferred from the grown substrate to the substrate in the display device, and then the Micro LED devices are electrically connected with the back plate of the display device. In the related art, for the flip-chip Micro LED devices, the cathode and anode silver glue process is used to electrically connect the Micro LED devices and the backplane. The cathode and anode silver glue short circuit, that is, Micro LED device short circuit, is easy to occur in the process of the cathode and anode silver glue process. For a vertical Micro LED device, the anode or cathode of the Micro LED device is electrically connected with the back plate after the transfer process, and the cathode or anode needs to be made on the whole back plate. If transfer loss of the Micro LED device occurs, it is easy to cause the cathode and anode short circuit of the Micro LED device. Short circuit of the Micro LED device may produce large current in the back plate, which may burn the back plate, resulting in a low product yield of the display device applying the Micro LED device.

Figure 1:
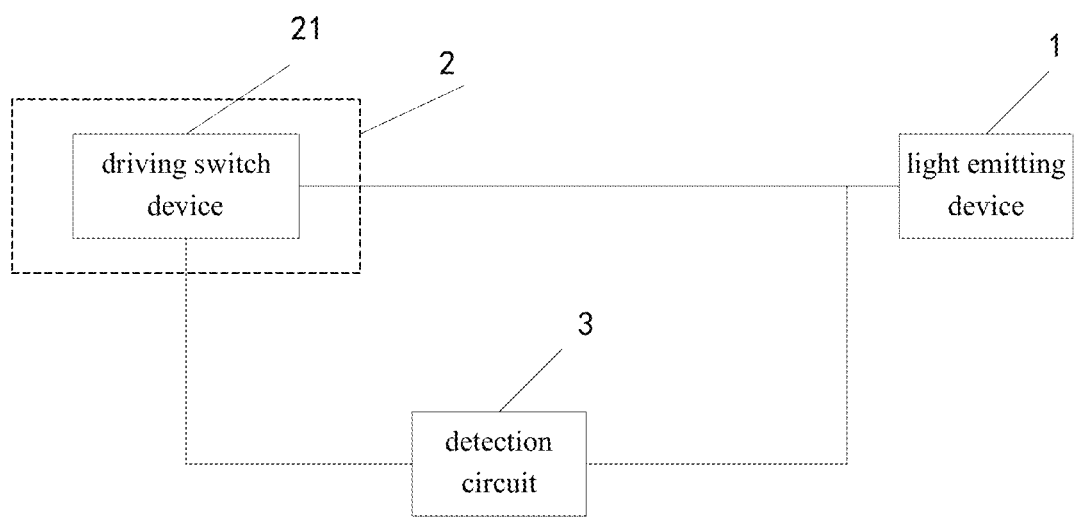
FIG. 1 is a block diagram of a light emitting control circuit according to an embodiment of the present disclosure.
Figure 2:
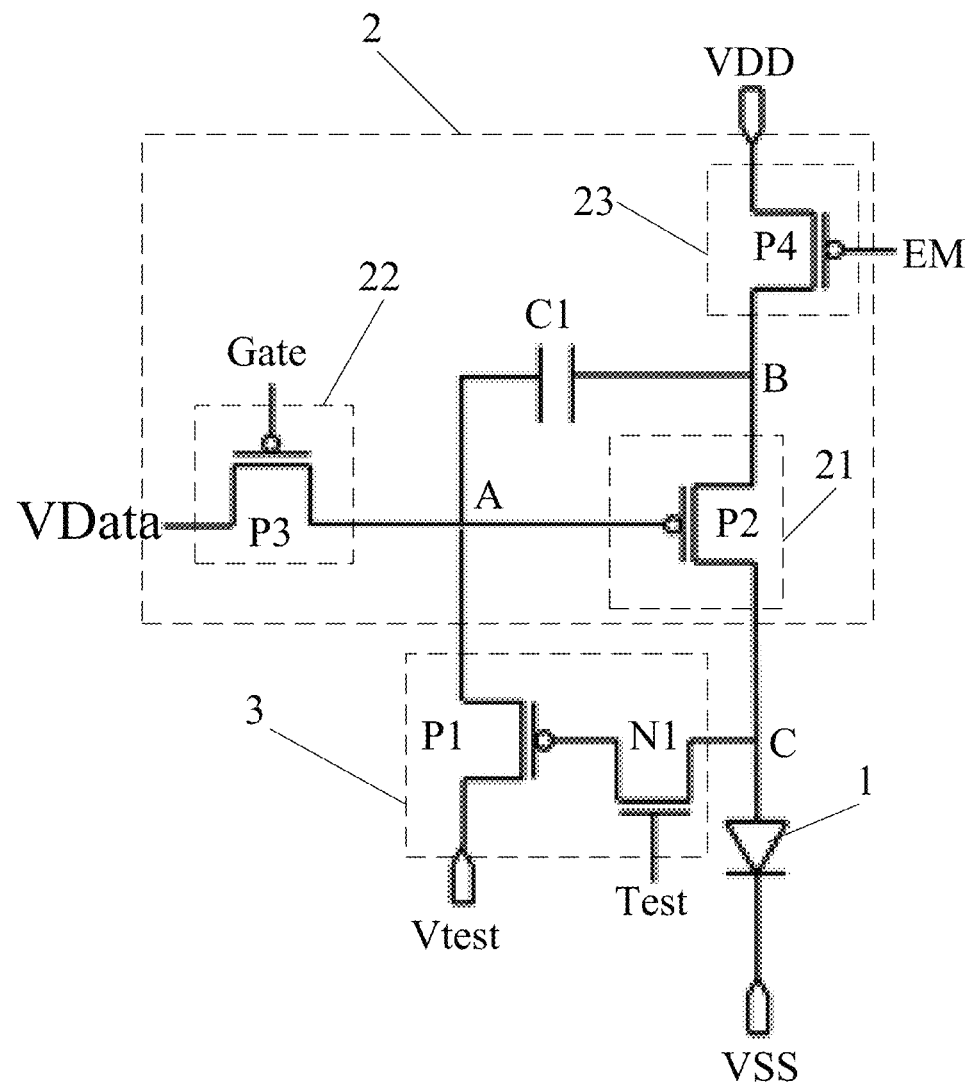
FIG. 2 is a schematic structural diagram of a light emitting control circuit according to an embodiment of the present disclosure.

In order to solve the short circuit problem of the Micro LED device, a light emitting control circuit is provided in the present disclosure, as shown in FIGS. 1-2.

FIG. 1 shows a block diagram of a light emitting control circuit according to an embodiment of the present disclosure, the light emitting control circuit may include: a light emitting device 1; a driving circuit 2 including a driving switch device 21, a first terminal of the driving switch device 21 is connected with an anode of the light emitting device 1, the driving switch device 21 is configured to drive the light emitting device 1 to emit light when the driving switch device 21 is turned on; a detection circuit 3, one terminal of the detection circuit 3 is connected with a control terminal of the driving switch device 21, and the other terminal of the detection circuit 3 is connected with the anode of the light emitting device 1, the detection circuit 3 is configured to detect whether the light emitting device 1 is short-circuited in the detection stage of the light emitting control circuit; if the light emitting device 1 is short-circuited, the driving switch device 21 is turned off in the light emitting stage of the light emitting control circuit; if the light emitting device 1 is not short-circuited, the driving switch device 21 is turned on in the light emitting stage of the light emitting control circuit.

If the light emitting device 1 is short-circuited, the driving switch device 21 is turned off in the light emitting stage of the light emitting control circuit, so as to avoid burning the back plate due to the short-circuit of the light emitting device; and if the light emitting device 1 is not short-circuited, the driving switch device 21 is turned on in the light emitting stage of the light emitting control circuit, so as to ensure that the light emitting device which is not short-circuited can emit light normally during the light emitting stage. The solution of the present disclosure can ensure the normal light emitting of the light emitting device 1 without short circuit, and at the same time avoid burning the back plate caused by short circuit of the light emitting device 1, thereby the yield of the display device applying the light emitting device 1 can be greatly improved.

Optionally, the light emitting device 1 may be a LED device, a Micro LED device, an electroluminescent device, or the like.

Optionally, the driving circuit 2 may be any driving circuit in the related art that can drive the light emitting device 1 to emit light and be applied to the array substrate, which is not limited by the present disclosure.

According to the embodiments of the present disclosure, the light emitting control circuit is provided on a back plate of the display device.

Optionally, in an embodiment of the present disclosure as shown in FIG. 2, the detection circuit 3 may include: a first switch device P1, a first terminal of the first switch device P1 is connected with the control terminal of the driving switch device 21, a second terminal of the first switch device P1 is connected with a test voltage terminal, a first node A is provided between the first terminal of the first switch device P1 and the control terminal of the driving switch device 21; a difference between the test voltage Vtest provided by the test voltage terminal and the voltage on the second terminal of the driving switch device 21 is greater than the turning-on voltage of the driving switch device 21; the first switch device P1 is configured to be turned on in the detection stage if the light emitting device 1 is short-circuited, or turned off in the detection stage if the light emitting device 1 is not short-circuited;

a second switch device N1, a first terminal of the second switch device N1 is connected with the control terminal of the first switch device P1, a control terminal of the second switch device N1 receives a detection control signal Test, a second terminal of the second switch device N1 is connected with the anode of the light emitting device 1, a second node C is provided between the second terminal of the second switch device N1 and the anode of the light emitting device 1; the second switch device N1 is configured to be turned on in the detection stage in response to the detection control signal Test, and turned off in the light emitting stage in response to the detection control signal Test.

Optionally, the first switch device may be a P-type TFT transistor, and the second switch device may be an N-type TFT transistor. Alternatively, in one embodiment of the present disclosure, referring to FIG. 2, the first switching device is a P-type TFT transistor P1 and the second switching device is an N-type TFT transistor N1. In FIG. 2, the drain of P-type TFT transistor P1 serves as the first terminal of the first switching device, the source of P-type TFT transistor P1 serves as the second terminal of the first switching device, and the gate of P-type TFT transistor P1 serves as the control terminal of the first switching device. The drain of the N-type TFT transistor N1 serves as the first terminal of the second switching device, the source of the N-type TFT transistor N1 serves as the second terminal of the second switching device, and the gate of the N-type TFT transistor N1 serves as the control terminal of the second switching device. In FIG. 2, the cathode of the light emitting device 1 is grounded.

Optionally, according to an embodiment of the present disclosure, as shown in FIG. 2, the driving circuit 2 further includes:

a data writing switch device 22, a first terminal of the data writing switch device 22 is connected with the data voltage terminal, and the control terminal of the data writing switch device 22 receives a gate control signal Gate, the second terminal of the data writing switch device 22 is connected with the control terminal of the driving switch device 21, the data writing switch device 22 is configured to be turned on in response to the gate control signal Gate in the data writing stage of the light emitting control circuit, the data voltage VData provided on the data voltage terminal is written into the capacitor C1 through the data writing switch device 22; and the data writing switch device 22 is configured to be turned off in response to the gate control signal Gate in the detection stage and the light emitting stage;

a light emitting control switch device 23, a first terminal of the light emitting control switch device 23 is connected with a power supply, and the control terminal of the light emitting control switch device 23 receives a light emitting control signal EM, the second terminal of the light emitting control switch device 23 is connected with the second terminal of the driving switch device 21, a third node B is provided between the second terminal of the light emitting control switch device 23 and the second terminal of the driving switch device 21; the light emitting control switch device 23 is configured to be turned off in response to the light emitting control signal EM in the data writing stage and the detection stage, the driving switch device 21 is turned off and the light emitting device 1 does not emit light; and the light emitting control switch device 23 is configured to be turned on in response to the light emitting control signal EM in the light emitting stage, if the light emitting device 1 is short-circuited, the driving switch device 21 is turned off and the light emitting device 1 does not emit light, if the light emitting device 1 is not short-circuited, the driving switch device 21 is turned on and the light emitting device 1 emits light;

a capacitor C1, one terminal of the capacitor C1 is respectively connected with the second terminal of the data writing switch device 22 and the control terminal of the driving switch device 21, the other terminal of the capacitor C1 is respectively connected with the second terminal of the light emitting control switch device 23 and the second terminal of the driving switch device 21.

Optionally, according to the embodiments of the present disclosure, the driving switch device, the data writing switch device and the light emitting control switch device may be P-type TFT transistors. As shown in FIG. 2, in an embodiment of the present disclosure, the driving switch device may be the P-type TFT transistor P2, the data writing switch device may be the P-type TFT transistor P3, and the light emitting control switch device may be the P-type TFT transistor P4.

Optionally, according to the embodiments of the present disclosure, the threshold voltage range of the first switch device may be:

$$VSS-Vtest<Vth1<VSS+Vled-Vtest$$

wherein, VSS is the cathode potential of the light emitting device 1, Vtest is the test voltage, Vth1 is the threshold voltage of the first switch device, and Vled is the turning-on voltage of the light emitting device 1.

Optionally, according to the embodiments of the present disclosure, the threshold voltage range of the driving switch device is:

$$VData-VDD<Vth3<Vtest-VDD$$

wherein, VData is the data voltage provided by the data voltage terminal, VDD is the power supply voltage, Vth3 is the threshold voltage of the driving switch device, and Vtest is the test voltage.

Figure 3:
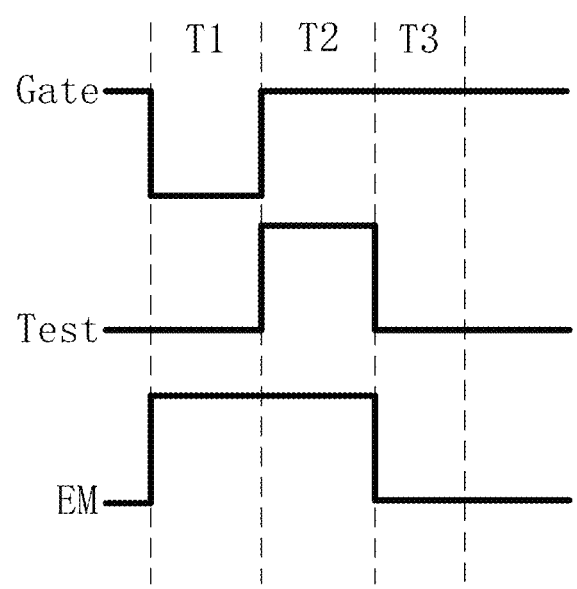
FIG. 3 is a schematic driving sequence of the light emitting control circuit shown in FIG. 2.

According to an embodiment of the present disclosure, a driving sequence for the light emitting control circuit of FIG. 2 is shown in FIG. 3, the driving sequence includes a data writing stage T1, a detection stage T2 and a light emitting stage T3.

In the data writing stage T1, The gate control signal Gate is a low level signal, the detection control signal Test is a low level signal, the light emitting control signal EM is a high level signal, the P-type TFT transistor P3 is turned on, the N-type TFT transistor N1 is turned off, the P-type TFT transistor P4 is turned off, the data voltage signal VData provided on the data voltage terminal is written into the capacitor C1 through the data writing switch device 22, and the voltage on node A is VData.

In the detection phase T2, the gate control signal Gate is a high level signal, the detection control signal Test is a high level signal, and the light emitting control signal EM is a high level signal. If the light emitting device 1 is short-circuited, the N-type TFT transistor N1 is turned on because the voltage on node C is VSS (ground), and the gate voltage of the P-type TFT transistor P1 is VSS, the voltage difference between the gate and the source of the P-type TFT transistor P1 is Vgs1=VSS−Vtest<Vth1, the P-type TFT transistor P1 is turned on, the voltage on node A is Vtest. If the light emitting device 1 is not short-circuited, the voltage on node C is VSS+Vled, the N-type TFT transistor N1 is turned on, and the gate voltage of the P-type TFT transistor P1 is VSS+Vled, the voltage difference between the gate and the source of the P-type TFT transistor P1 is Vgs1=VSS+Vled−Vtest>Vth1, the P-type TFT transistor P1 is turned off, and the voltage on node A is VData.

In the light emitting stage T3, the gate control signal Gate is a high level signal, the detection control signal Test is a low level signal, and the light emitting control signal EM is a low level signal. If the light emitting device 1 is short-circuited, since the voltage on node A is Vtest, the voltage on node B is VDD, the voltage difference between the gate and the source of the P type TFT transistor P2 is Vgs2=Vtest−VDD>Vth3, the P type TFT transistor P2 is turned off, the light emitting device 1 does not emit light; if the light emitting device 1 is not short-circuited, since the P type TFT transistor P1 is turned off, the voltage on node A is VData, the voltage on node B is VDD, the voltage difference between the gate and the source of the P type TFT transistor P2 is Vgs2=VData−VDD<Vth3, the P type TFT transistor P2 is turned on, and the light emitting device 1 emits light normally.

The light emitting control circuit according to the embodiments of the present disclosure has the following advantages: the light emitting control circuit is provided on a back plate, and includes: a light emitting device; a driving circuit including a driving switch device, a first terminal of the driving switch device is connected with an anode of the light emitting device, the driving switch device is configured to drive the light emitting device to emit light when the driving switch device is turned on; a detection circuit, one terminal of the detection circuit is connected with a control terminal of the driving switch device, and the other terminal of the detection circuit is connected with the anode of the light emitting device, the detection circuit is configured to detect whether the light emitting device is short-circuited in the detection stage of the light emitting control circuit; if the light emitting device is short-circuited, the driving switch device is turned off in the light emitting stage of the light emitting control circuit, so as to avoid burning the back plate due to the short-circuit of the light emitting device; and if the light emitting device is not short-circuited, the driving switch device is turned on in the light emitting stage of the light emitting control circuit, so as to ensure that the light emitting device which is not short-circuited can emit light normally during the light emitting stage. Therefore, The solution of the present disclosure can ensure the normal light emitting of the light emitting device 1 without short circuit, and at the same time avoid burning the back plate caused by short circuit of the light emitting device 1, thereby the yield of the display device applying the light emitting device 1 can be greatly improved.

According to the embodiments of the present disclosure, an array substrate is further provided, the array substrate includes a plurality of pixel units arranged in an array, each of which includes a light emitting control circuit described above.

The array substrate according to the embodiments of the present disclosure has the following advantages: the light emitting control circuit is provided on a back plate, and includes: a light emitting device; a driving circuit including a driving switch device, a first terminal of the driving switch device is connected with an anode of the light emitting device, the driving switch device is configured to drive the light emitting device to emit light when the driving switch device is turned on; a detection circuit, one terminal of the detection circuit is connected with a control terminal of the driving switch device, and the other terminal of the detection circuit is connected with the anode of the light emitting device, the detection circuit is configured to detect whether the light emitting device is short-circuited in the detection stage of the light emitting control circuit; if the light emitting device is short-circuited, the driving switch device is turned off in the light emitting stage of the light emitting control circuit, so as to avoid burning the back plate due to the short-circuit of the light emitting device; and if the light emitting device is not short-circuited, the driving switch device is turned on in the light emitting stage of the light emitting control circuit, so as to ensure that the light emitting device which is not short-circuited can emit light normally during the light emitting stage. Therefore, The solution of the present disclosure can ensure the normal light emitting of the light emitting device 1 without short circuit, and at the same time avoid burning the back plate caused by short circuit of the light emitting device 1, thereby the yield of the display device applying the light emitting device 1 can be greatly improved.

According to the embodiments of the present disclosure, a display device including the above array substrate is further provided.

The display device according to the embodiments of the present disclosure has the following advantages: the light emitting control circuit is provided on a back plate (array substrate), and includes: a light emitting device; a driving circuit including a driving switch device, a first terminal of the driving switch device is connected with an anode of the light emitting device, the driving switch device is configured to drive the light emitting device to emit light when the driving switch device is turned on; a detection circuit, one terminal of the detection circuit is connected with a control terminal of the driving switch device, and the other terminal of the detection circuit is connected with the anode of the light emitting device, the detection circuit is configured to detect whether the light emitting device is short-circuited in the detection stage of the light emitting control circuit; if the light emitting device is short-circuited, the driving switch device is turned off in the light emitting stage of the light emitting control circuit, so as to avoid burning the back plate due to the short-circuit of the light emitting device; and if the light emitting device is not short-circuited, the driving switch device is turned on in the light emitting stage of the light emitting control circuit, so as to ensure that the light emitting device which is not short-circuited can emit light normally during the light emitting stage. Therefore, the solution of the present disclosure can ensure the normal light emitting of the light emitting device 1 without short circuit, and at the same time avoid burning the back plate caused by short circuit of the light emitting device 1, thereby the yield of the display device applying the light emitting device 1 can be greatly improved.

According to the embodiments of the present disclosure, a method for driving the light emitting control circuit is further provided, the driving method includes a data writing stage, a detection stage and a light emitting stage, wherein in the data writing stage, the driving switch device 21 and the detection circuit 3 are turned off, and the data voltage VData is applied across the control terminal of the driving switch device 21 and the second terminal of the driving switch device 21 through the driving circuit 2;

in the detection stage, the driving circuit 2 is turned off, and the detection circuit 3 detects whether the light emitting device 1 is short-circuited, wherein if the light emitting device 1 is short-circuited, the voltage on the control terminal of the driving switch device 21 is the voltage on one terminal of the detection circuit 3, and if the light emitting device 1 is not short-circuited, the voltage on the control terminal of the driving switch device 21 is the data voltage VData;

in the light emitting stage, if the light emitting device 1 is short-circuited, since the voltage on the control terminal of the driving switch device 21 is the voltage on one terminal of the detection circuit 3, the driving switch device 21 is controlled by the detection circuit 3 to be turned off, the light emitting device 1 does not emit light; if the light emitting device 1 is not short-circuited, the voltage on the control terminal of the driving switch device 21 is the data voltage VData, the driving switch device 21 is controlled by the detection circuit 3 to be turned on, so that the driving switch device 21 drives the light emitting device 1 to emit light.

In an embodiment of the present disclosure, a driving method of the light emitting control circuit in FIG. 2 is shown in FIG. 3, the driving method includes three stages (the data writing stage T1, detection stage T2 and light emitting stage T3) as follows:

In the data writing stage T1, The gate control signal Gate is a low level signal, the detection control signal Test is a low level signal, the light emitting control signal EM is a high level signal, the P-type TFT transistor P3 is turned on, the N-type TFT transistor N1 is turned off, the P-type TFT transistor P4 is turned off, the data voltage signal VData provided on the data voltage terminal is written into the capacitor C1 through the data writing switch device 22, and the voltage on node A is VData.

In the detection phase T2, the gate control signal Gate is a high level signal, the detection control signal Test is a high level signal, and the light emitting control signal EM is a high level signal. If the light emitting device 1 is short-circuited, the N-type TFT transistor N1 is turned on because the voltage on node C is VSS (ground), and the gate voltage of the P-type TFT transistor P1 is VSS, the voltage difference between the gate and the source of the P-type TFT transistor P1 is $Vgs1=VSS-Vtest<Vth1$, the P-type TFT transistor P1 is turned on, the voltage on node A is Vtest. If the light emitting device 1 is not short-circuited, the voltage on node C is VSS+Vled, the N-type TFT transistor N1 is turned on, and the gate voltage of the P-type TFT transistor P1 is VSS+Vled, the voltage difference between the gate and the source of the P-type TFT transistor P1 is $Vgs1=VSS+Vled-Vtest>Vth1$, the P-type TFT transistor P1 is turned off, and the voltage on node A is VData.

In the light emitting stage T3, the gate control signal Gate is a high level signal, the detection control signal Test is a low level signal, and the light emitting control signal EM is a low level signal. If the light emitting device 1 is short-circuited, since the voltage on node A is Vtest, the voltage on node B is VDD, the voltage difference between the gate and the source of the P type TFT transistor P2 is $Vgs2=Vtest-VDD>Vth3$, the P type TFT transistor P2 is turned off, the light emitting device 1 does not emit light; if the light emitting device 1 is not short-circuited, since the P type TFT transistor P1 is turned off, the voltage on node A is VData, the voltage on node B is VDD, the voltage difference between the gate and the source of the P type TFT transistor P2 is $Vgs2=VData-VDD<Vth3$, the P type TFT transistor P2 is turned on, and the light emitting device 1 emits light normally.

According to the embodiments of the present disclosure, the light emitting control circuit is provided on a back plate, and includes: a light emitting device; a driving circuit including a driving switch device, a first terminal of the driving switch device is connected with an anode of the light emitting device, the driving switch device is configured to drive the light emitting device to emit light when the driving switch device is turned on; a detection circuit, one terminal of the detection circuit is connected with a control terminal of the driving switch device, and the other terminal of the detection circuit is connected with the anode of the light emitting device, the detection circuit is configured to detect whether the light emitting device is short-circuited in the detection stage of the light emitting control circuit; if the light emitting device is short-circuited, the driving switch device is turned off in the light emitting stage of the light emitting control circuit, so as to avoid burning the back plate due to the short-circuit of the light emitting device; and if the light emitting device is not short-circuited, the driving switch device is turned on in the light emitting stage of the light emitting control circuit, so as to ensure that the light emitting device which is not short-circuited can emit light normally during the light emitting stage. Therefore, The solution of the present disclosure can ensure the normal light emitting of the light emitting device 1 without short circuit, and at the same time avoid burning the back plate caused by short circuit of the light emitting device 1, thereby the yield of the display device applying the light emitting device 1 can be greatly improved.

The array substrate and the display device have been described briefly since the light emitting control circuit is included therein. For the related part, descriptions to the embodiment of the light emitting control circuit can be taken as a reference. Also the related part in the driving method of the light emitting control circuit may refer to the descriptions to the embodiment of the light emitting control circuit.

The various embodiments in the present disclosure are described in a progressive manner, each embodiment focuses on a different aspect from other embodiments, and the same or similar parts among the various embodiments can refer to each other.

Those skilled in the art should understand that some embodiments of the present disclosure may be provided as a method, a device, or a computer program product. Therefore, some embodiments of the present disclosure may be a form of a hardware embodiment, a software embodiment, or an embodiment combining software with hardware. Moreover, some embodiments of the present disclosure may be implemented in a form of a computer program product implemented on one or more computer usable storage media (including but not limited to a disk storage, a CD-ROM, an optical storage, etc.) containing a computer usable program code.

Some embodiments of the present disclosure are described with reference to flowcharts and/or block diagrams of a method, a user equipment (system) and a computer program product in some embodiments of the present disclosure. It should be appreciated that each process in the flowcharts and/or each block in the block diagrams, and a combination of a process in the flowcharts and/or a block in the block diagrams may be implemented by computer program instructions. The computer program instructions may be provided to a processor of a general purpose computer, a special purpose computer, an embedded processor, or other programmable data processing devices to produce a machine, such that the instructions executed by the processor of the computer or other programmable data processing devices produces a device for realizing functions specified in one or more processes in the flowcharts and/or one or more blocks in the block diagrams.

The computer program instructions may also be stored in a computer readable memory capable of directing a computer or other programmable data processing devices to operate in a particular manner, such that the instructions stored in the computer readable memory produce a manufacture including an instruction device, the instruction device implements functions specified in one or more processes in the flowcharts and/or one or more blocks in the block diagrams.

The computer program instructions may also be loaded onto the computer or other programmable data processing devices, so that a series of operating steps may be performed on the computer or other programmable devices to produce a computer-implemented processing, and thus instructions executed by the computer or other programmable devices provide steps for implementing the functions specified in one or more processes in the flowcharts and/or one or more blocks in the block diagrams.

Although some optional embodiments of the present disclosure have been described, those skilled in the art may make other replacements and modifications to these embodiments once they know basic inventive concepts. Therefore, the appended claims are intended to be construed to include the optional embodiments and all replacements and modifications that fall within the scope of the embodiments of the present disclosure.

It should be noted that in the present disclosure, terms describing relations such as first and second are used only to distinguish one entity or operation from another entity or operation, and do not necessarily require or imply that there is any such actual relationship or order between the entities or operations. Moreover, a term "include", "have" or any other variation thereof is intended to encompass non-exclusive inclusion, such that a process, a method, a product or a device including a series of elements includes not only those elements, but also other elements not explicitly listed, or elements inherent to the process, the method, the product or the device. Without more restrictions, an element defined by an expression "including a . . . " does not exclude existence of other identical or different elements in the process, the method, the product or the device including the element.

The light emitting control circuit, the array substrate, the display device, and the driving method of the light emitting control circuit have been described in detail. The aforementioned embodiments are provided for explain the principle and implementation of the present disclosure. For those skilled in the art, modifications may be made on the basis of the present disclosure, thus the specific embodiments shall not be construed as limitation to the present disclosure.

What is claimed is:

1. A light emitting control circuit, comprising:
    a light emitting device;
    a driving circuit comprising a driving switch device, a first terminal of the driving switch device is connected with an anode of the light emitting device, the driving switch device is configured to drive the light emitting device to emit light when the driving switch device is turned on; and
    a detection circuit, one terminal of the detection circuit is connected with a control terminal of the driving switch device, and the other terminal of the detection circuit is connected with the anode of the light emitting device, the detection circuit is configured to detect whether the light emitting device is short-circuited in a detection stage of the light emitting control circuit; if the light emitting device is short-circuited, the driving switch device is turned off in a light emitting stage of the light emitting control circuit; if the light emitting device is not short-circuited, the driving switch device is turned on in the light emitting stage of the light emitting control circuit,
    wherein the detection circuit comprises:
        a first switch device, a first terminal of the first switch device is connected with the control terminal of the driving switch device, a second terminal of the first switch device is connected with a test voltage terminal; a difference between the test voltage provided by the test voltage terminal and the voltage on the second terminal of the driving switch device is greater than a turning-on voltage of the driving switch device; the first switch device is configured to be turned on in the detection stage if the light emitting device is short-circuited, or turned off in the detection stage if the light emitting device is not short-circuited; and
        a second switch device, a first terminal of the second switch device is connected with the control terminal of the first switch device, a control terminal of the second switch device receives a detection control signal, a second terminal of the second switch device is connected with the anode of the light emitting device; the second switch device is configured to be turned on in the detection stage in response to the detection control signal, and turned off in the light emitting stage in response to the detection control signal.

2. The light emitting control circuit according to claim 1, wherein the first switch device is a P-type TFT transistor, and the second switch device is an N-type TFT transistor.

3. The light emitting control circuit according to claim 2, wherein a threshold voltage range of the first switch device is:

$$VSS-Vtest<Vth1<VSS+Vled-Vtest$$

wherein, VSS is the cathode potential of the light emitting device, Vtest is the test voltage, Vth1 is a threshold voltage of the first switch device, and Vled is the turning-on voltage of the light emitting device.

4. The light emitting control circuit according to claim 1, wherein the driving circuit further comprises:
    a data writing switch device, a first terminal of the data writing switch device is connected with the data voltage terminal, and the control terminal of the data writing switch device receives a gate control signal, the second terminal of the data writing switch device is connected with the control terminal of the driving switch device, the data writing switch device is configured to be turned on in response to the gate control signal in the data writing stage of the light emitting control circuit, and turned off in response to the gate control signal in the detection stage and the light emitting stage;

a light emitting control switch device, a first terminal of the light emitting control switch device is connected with a power supply, and the control terminal of the light emitting control switch device receives a light emitting control signal, the second terminal of the light emitting control switch device is connected with the second terminal of the driving switch device, the light emitting control switch device is configured to be turned off in response to the light emitting control signal in the data writing stage and the detection stage, and turned on in response to the light emitting control signal in the light emitting stage; and a capacitor, one terminal of the capacitor is respectively connected with the second terminal of the data writing switch device and the control terminal of the driving switch device, the other terminal of the capacitor is respectively connected with the second terminal of the light emitting control switch device and the second terminal of the driving switch device.

5. The light emitting control circuit according to claim 4, wherein the driving switch device, the data writing switch device and the light emitting control switch device are P-type TFT transistors.

6. The light emitting control circuit according to claim 5, wherein the threshold voltage range of the driving switch device is:

$$VData-VDD<Vth3<Vtest-VDD$$

wherein, VData is the data voltage provided by the data voltage terminal, VDD is the power supply voltage, Vth3 is the threshold voltage of the driving switch device, and Vtest is the test voltage.

7. The light emitting control circuit according to claim 1, wherein a threshold voltage range of the first switch device is:

$$VSS-Vtest<Vth1<VSS+Vled-Vtest$$

wherein, VSS is the cathode potential of the light emitting device, Vtest is the test voltage, Vth1 is a threshold voltage of the first switch device, and Vled is the turning-on voltage of the light emitting device.

8. An array substrate, comprising a plurality of pixel units arranged in an array, each of which comprises a light emitting control circuit according to claim 1.

9. A display device, comprising the array substrate according to claim 8.

10. A method for driving the light emitting control circuit according to claim 1, comprising a data writing stage, a detection stage and a light emitting stage, wherein in the data writing stage, the driving switch device and the detection circuit are turned off, and the data voltage is applied across the control terminal of the driving switch device and the second terminal of the driving switch device through the driving circuit;

in the detection stage, the driving circuit is turned off, and the detection circuit detects whether the light emitting device is short-circuited;

in the light emitting stage, if the light emitting device is short-circuited, the driving switch device is controlled by the detection circuit to be turned off, and if the light emitting device is not short-circuited, the driving switch device is controlled by the detection circuit to be turned on, so that the driving switch device drives the light emitting device to emit light.

* * * * *